US012601761B2

(12) United States Patent
Lu et al.

(10) Patent No.: US 12,601,761 B2
(45) Date of Patent: Apr. 14, 2026

(54) VERTICAL PROBE CARD AND OPEN-TYPE PROBE THEREOF

(71) Applicant: CHUNGHWA PRECISION TEST TECH. CO., LTD., Taoyuan City (TW)

(72) Inventors: Yu-Ju Lu, Taoyuan City (TW);
Yi-Hsien Chen, Taoyuan City (TW);
Meng-Chieh Cheng, Taipei City (TW);
Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 155 days.

(21) Appl. No.: 18/632,321

(22) Filed: Apr. 11, 2024

(65) Prior Publication Data

US 2024/0377437 A1     Nov. 14, 2024

(30) Foreign Application Priority Data

May 11, 2023     (TW) ................................. 112117467

(51) Int. Cl.
G01R 1/073         (2006.01)
G01R 1/067         (2006.01)

(52) U.S. Cl.
CPC ..... G01R 1/07342 (2013.01); G01R 1/06716 (2013.01)

(58) Field of Classification Search
CPC ........................ G01R 1/07342; G01R 1/06716
See application file for complete search history.

(56) References Cited

U.S. PATENT DOCUMENTS

| | | | |
|---|---|---|---|
| 2008/0032529 A1* | 2/2008 | Shimada ............ | G01R 1/06722 |
| | | | 439/135 |
| 2013/0099811 A1* | 4/2013 | Lee ................... | G01R 1/06722 |
| | | | 324/754.11 |
| 2021/0048452 A1* | 2/2021 | Yang .................. | G01R 1/06722 |
| 2025/0180603 A1* | 6/2025 | Ahn ................... | G01R 1/06716 |

* cited by examiner

*Primary Examiner* — Paresh Patel
(74) *Attorney, Agent, or Firm* — Li & Cai Intellectual Property Office

(57)          ABSTRACT

An open-type probe of a vertical probe card includes a frame, an elastic member, and a pin. The frame has an operation slot and two lateral openings being in spatial communication with the operation slot. The elastic member is assembled to the frame and is located in the operation slot. The pin includes an inner segment assembled in the operation slot and a contacting segment that protrudes from an opening of the operation slot. The pin abuts against the elastic member through the inner segment so as to be electrically coupled to the frame. The elastic member and the inner segment are arranged between the two lateral openings. The contacting segment is configured to abut against a device under test, so that the contacting segment is moved toward the operation slot to press the elastic member for deforming the elastic member to generate an elastic force.

10 Claims, 10 Drawing Sheets

VERTICAL PROBE CARD AND OPEN-TYPE PROBE THEREOF

CROSS-REFERENCE TO RELATED PATENT APPLICATION

This application claims the benefit of priority to Taiwan Patent Application No. 112117467, filed on May 11, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a vertical probe card and an open-type probe thereof.

BACKGROUND OF THE DISCLOSURE

A conventional pogo pin applied in a probe card has a metal housing and a spring that is assembled and enclosed in the metal housing. Over the years, the conventional pogo pin has gradually been considered to have no more need for improvement in terms of its structural configuration, such that development thereof is largely at a standstill.

SUMMARY OF THE DISCLOSURE

In response to the above-referenced technical inadequacies, the present disclosure provides a vertical probe card and an open-type probe thereof for effectively improving on the issues associated with conventional pogo pins.

In order to solve the above-mentioned problems, one of the technical aspects adopted by the present disclosure is to provide a vertical probe card, which includes a first guide plate unit, a second guide plate unit corresponding in position to and spaced apart from the first guide plate unit along a thickness direction, a plurality of conductive probes assembled to the first guide plate unit and the second guide plate unit, and a plurality of open-type probes that are assembled to the first guide plate unit. Each of the conductive probes includes a transmission segment having two end portions respectively arranged in the first guide plate unit and the second guide plate unit, a testing segment extending from one of the two end portions of the transmission segment to protrude out of the first guide plate unit, and a transferring segment extending from another one of the two end portions of the transmission segment to protrude out of the second guide plate unit. Each of the open-type probes includes a frame, an elastic member, and a pin. The frame is coupled through and fixed in the first guide plate unit. The frame has an operation slot and two lateral openings that are in spatial communication with the operation slot, and an end opening of the operation slot is arranged away from the second guide plate unit. The elastic member is assembled in the frame and is arranged in the operation slot. The pin has an inner segment assembled in the operation slot and a contacting segment that is connected to the inner segment. The elastic member is compressed by the frame and the inner segment so as to establish an electrical connection between the frame and the pin, and the contacting segment protrudes from the end opening and the first guide plate unit. The elastic member and the inner segment of the pin are located between the two lateral openings. In each of the open-type probes, the contacting segment of the pin is configured to abut against a device under test (DUT), so that the contacting segment is moved toward the operation slot, and the inner segment presses the elastic member, such that the elastic member is deformed to generate an elastic force.

In order to solve the above-mentioned problems, another one of the technical aspects adopted by the present disclosure is to provide an open-type probe of a vertical probe card, which includes a frame, an elastic member, and a pin. The frame has an operation slot and two lateral openings that are in spatial communication with the operation slot. The operation slot has an end opening. The elastic member is assembled in the frame and is arranged in the operation slot. The pin has an inner segment assembled in the operation slot and a contacting segment that is connected to the inner segment. The elastic member is compressed by the frame and the inner segment so as to establish an electrical connection between the frame and the pin, and the contacting segment protrudes from the end opening. The elastic member and the inner segment of the pin are located between the two lateral openings. The contacting segment of the open-type probe is configured to abut against a device under test (DUT), so that the contacting segment is moved toward the operation slot, and the inner segment presses the elastic member, such that the elastic member is deformed to generate an elastic force.

Therefore, the open-type probe of the vertical probe card in the present disclosure is provided with the frame having a specific structural design (e.g., the frame having the two lateral openings), so that the elastic member and the pin can be easily assembled to the frame for reducing the manufacturing difficulty and maintenance complexity of the open-type probe. Specifically, the structural improvement of the open-type probe provided by the present disclosure is based on the operation and configuration of the vertical probe card, such that the improvement does not need to be limited by the structure of pogo pins that are applied in other technical fields.

Moreover, the probe length of the open-type probe in the vertical probe card provided by the present disclosure is much smaller than the length of the conductive probe, thereby facilitating transmission of signals (e.g., a high-frequency signal, a high-speed signal, or a loop-back signal) that are not suitable to be transmitted by the conductive probe.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
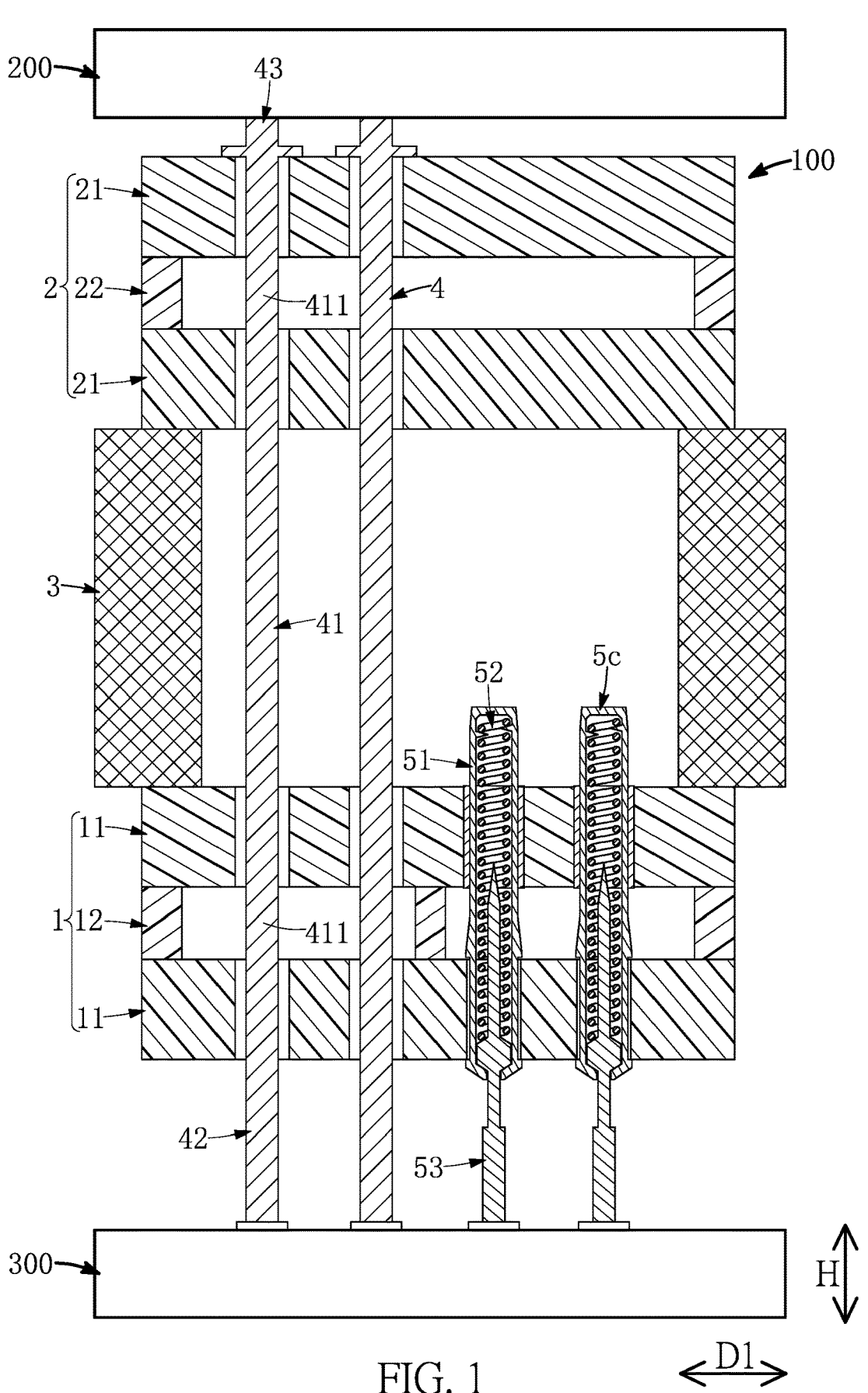
FIG. 1 is a schematic cross-sectional view of a vertical probe card according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
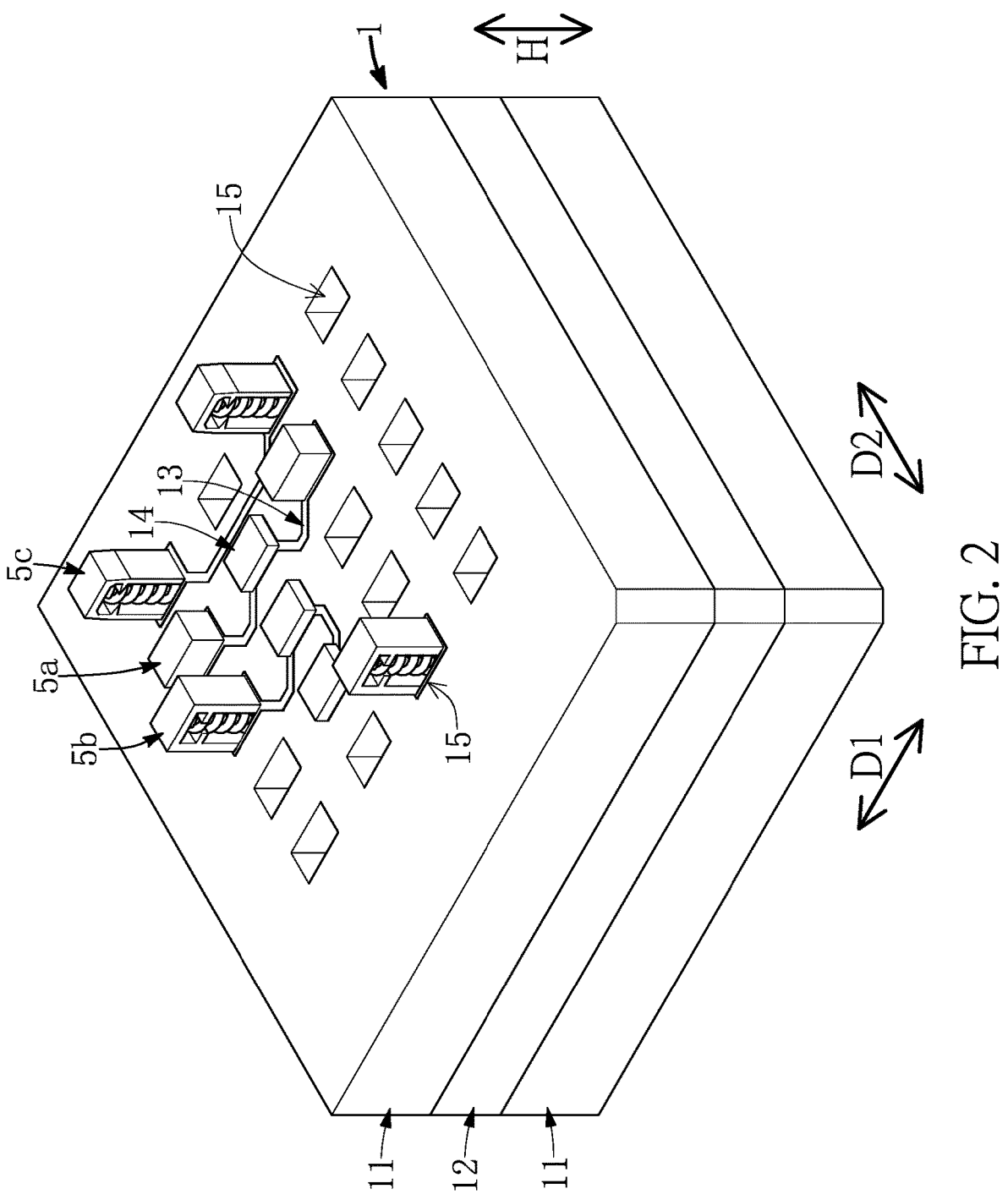
FIG. 2 is a schematic perspective view showing a part of the vertical probe card according to the embodiment of the present disclosure.
Figure 3:
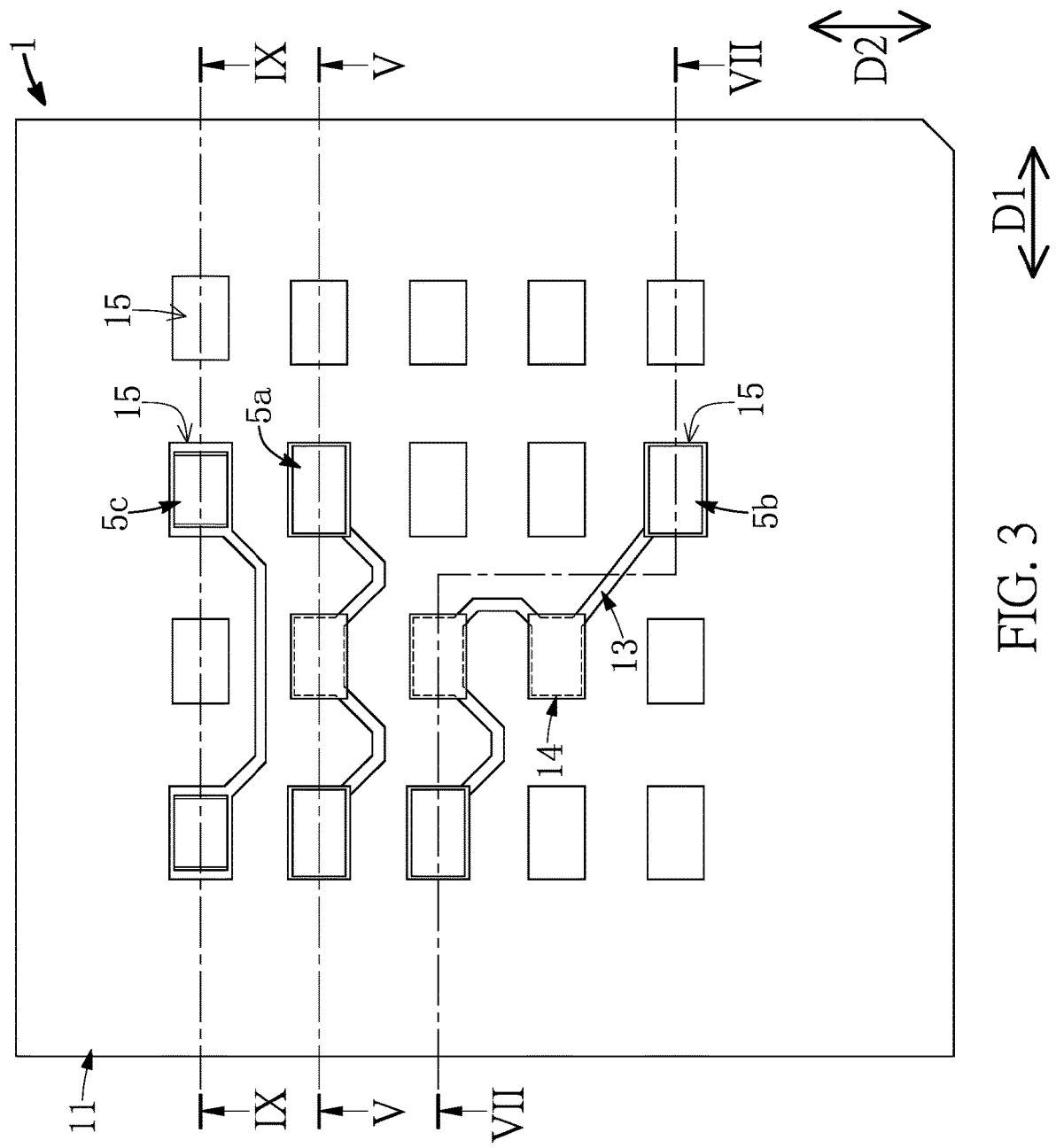
FIG. 3 is a schematic top view of FIG. 2.
Figure 4:
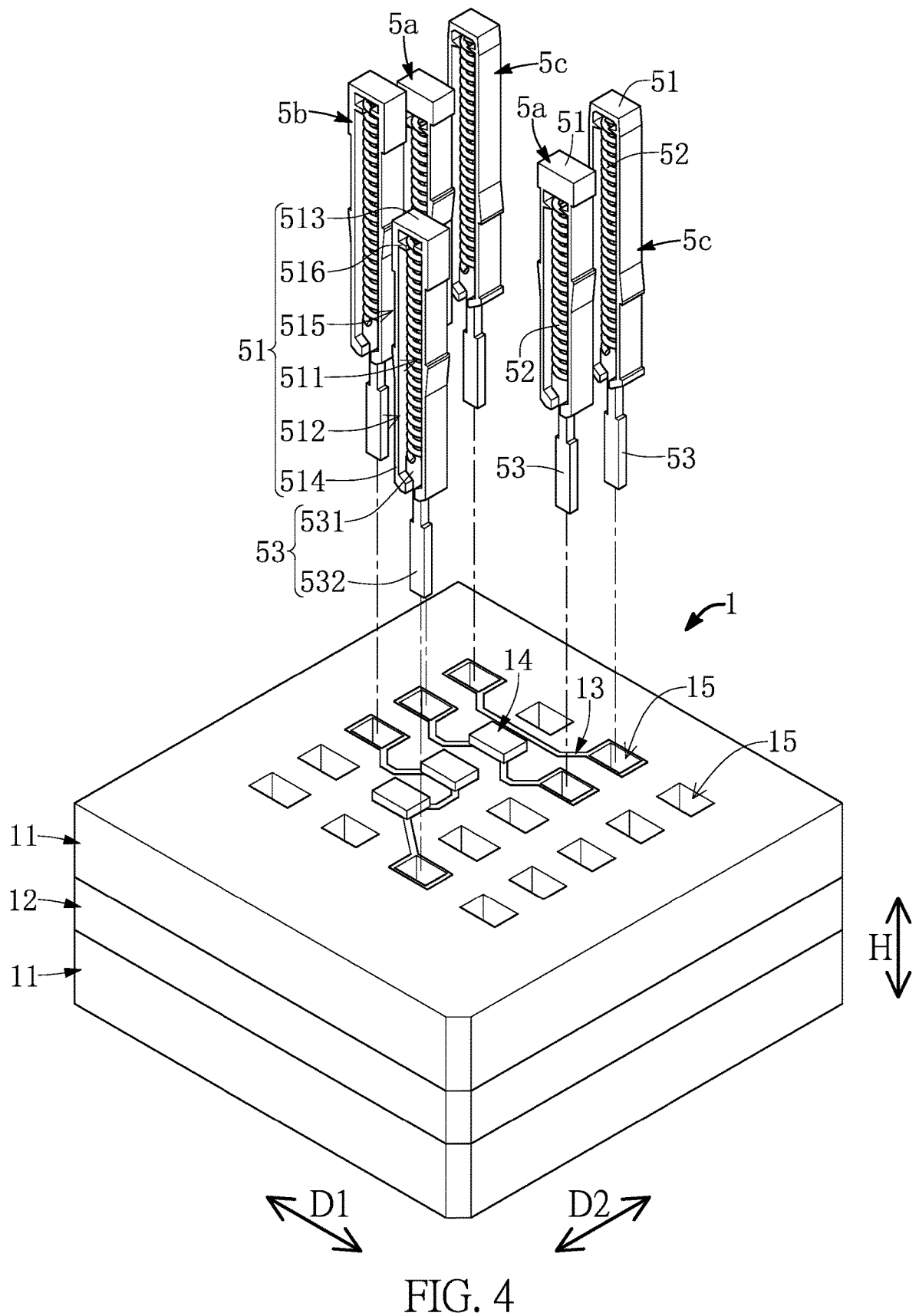
FIG. 4 is a schematic exploded view of FIG. 2.

Referring to FIG. 1 to FIG. 10, an embodiment of the present disclosure provides a vertical probe card 100. As shown in FIG. 1 to FIG. 3, one side of the vertical probe card 100 is configured to be connected to a space transformer 200, and another side of the vertical probe card 100 is configured to detachably abut against a device under test (DUT) for test.

It should be noted that in order to clearly describe the structure and connection relationship of each component of the vertical probe card 100, the drawings of the present embodiment only show a portion of the vertical probe card 100. The following description describes the structure and connection relationship of each component of the vertical probe card 100.

The vertical probe card 100 includes a first guide plate unit 1, a second guide plate unit 2 corresponding in position to and spaced apart from the first guide plate 1 unit along a thickness direction H, a spacer 3 sandwiched between the first guide plate unit 1 and the second guide plate unit 2, a plurality of conductive probes 4 assembled to the first guide plate unit 1 and the second guide plate unit 2, and a plurality of open-type probes 5a, 5b, 5c that are assembled to the first guide plate unit 1.

In addition, the open-type probes 5a, 5b, 5c in the present embodiment are described in cooperation with the first guide plate unit 1, the second guide plate unit 2, the spacer 3, and the conductive probes 4, but the present disclosure is not limited thereto. For example, in other embodiments of the present disclosure not shown in the drawings, the open-type probe 5a, 5b, 5c can be independently used (e.g., sold) or can be used in cooperation with other components.

The first guide plate unit 1 in the present embodiment includes two first plates 11 spaced apart from each other along the thickness direction H, a partition plate 12 sandwiched between the two first plates 11, a plurality of transmission circuits 13 formed on at least one of the two first plates 11, and a plurality of electronic components 14 (e.g., passive components such as capacitors or resistors) that are assembled on at least one of the transmission circuits 13, but the present disclosure is not limited thereto. For example, in other embodiments of the present disclosure not shown in the drawings, the first guide plate unit 1 can be a single plate; or, the transmission circuits 13 and/or the electronic components 14 can be omitted according to design requirements; or, the first guide plate unit 1 can have at least one of the transmission circuits 13 (and at least one of the electronic components 14).

In other words, the first guide plate unit 1 has a plurality of thru-holes 15 each extending along the thickness direction H, and at least one of the transmission circuits 13 is formed on a board surface of one of the two first plates 11 and further extends to inner walls of two of the thru-holes 15. Moreover, the electronic components 14 are disposed on portions of the first guide plate unit 1 not having the thru-holes 15. In a top view of the first guide plate unit 1, the electronic components 14 and the thru-holes 15 in the present embodiment can be in a matrix arrangement. In other words, the electronic components 14 and the thru-holes 15 are arranged in multiple rows along a first direction D1 perpendicular to the thickness direction H, and are arranged in multiple columns along a second direction D2 perpendicular to the thickness direction H and the first direction D1.

Moreover, the second guide plate unit 2 includes two second plates 21 spaced apart from each other and a spacing sheet 22 that is sandwiched between peripheral portions of the two second plates 21. In addition, the spacer 3 can be an annular structure sandwiched between peripheral portions of the first guide plate unit 1 and the second guide plate unit 2, but the present disclosure is not limited thereto. For example, in other embodiments of the present disclosure not shown in the drawings, the spacer 3 of the vertical probe card 100 can be omitted or can be replaced by other components.

As the conductive probes 4 in the present embodiment are of the substantially same structure, the following description discloses the structure of just one of the conductive probes 4 for the sake of brevity, but the present disclosure is not limited thereto. For example, in other embodiments of the present disclosure not shown in the drawings, the conductive probes 4 of the vertical probe card 100 can be of different structures.

The conductive probe 4 in the present embodiment is integrally formed as a single one-piece structure, and includes a transmission segment 41, a testing segment 42, and a transferring segment 43, the latter two of which extend from the transmission segment 41. Two end portions 411 of the transmission segment 41 are respectively arranged in the first guide plate unit 1 and the second guide plate unit 2, and the first guide plate unit 1 and the second guide plate unit 2 are staggered with each other, so that the transmission segment 41 is elastically bent for being capable of absorbing an external force and providing a stroke.

Moreover, the testing segment 42 extends from one of the two end portions 411 of the transmission segment 41 to protrude out of the first guide plate unit 1, and the two first plates 11 of the first guide plate unit 1 can be staggered with each other for holding the end portion 411 connected to the testing segment 42, thereby enabling the testing segment 42 to be as parallel to the thickness direction H as possible.

In addition, the transferring segment 43 extends from another one of the two end portions 411 of the transmission segment 31 to protrude out of the second guide plate unit 2, and the two second plates 21 of the second guide plate unit 2 can be slightly staggered with each other for holding the end portion 411 connected to the transferring segment 43, thereby controlling a swing direction of the transferring segment 43 (or enabling the transferring segment 43 to be as parallel to the thickness direction H as possible). The transferring segment 43 of each of the conductive probes 4 is connected to the space transformer 200.

Figure 5:
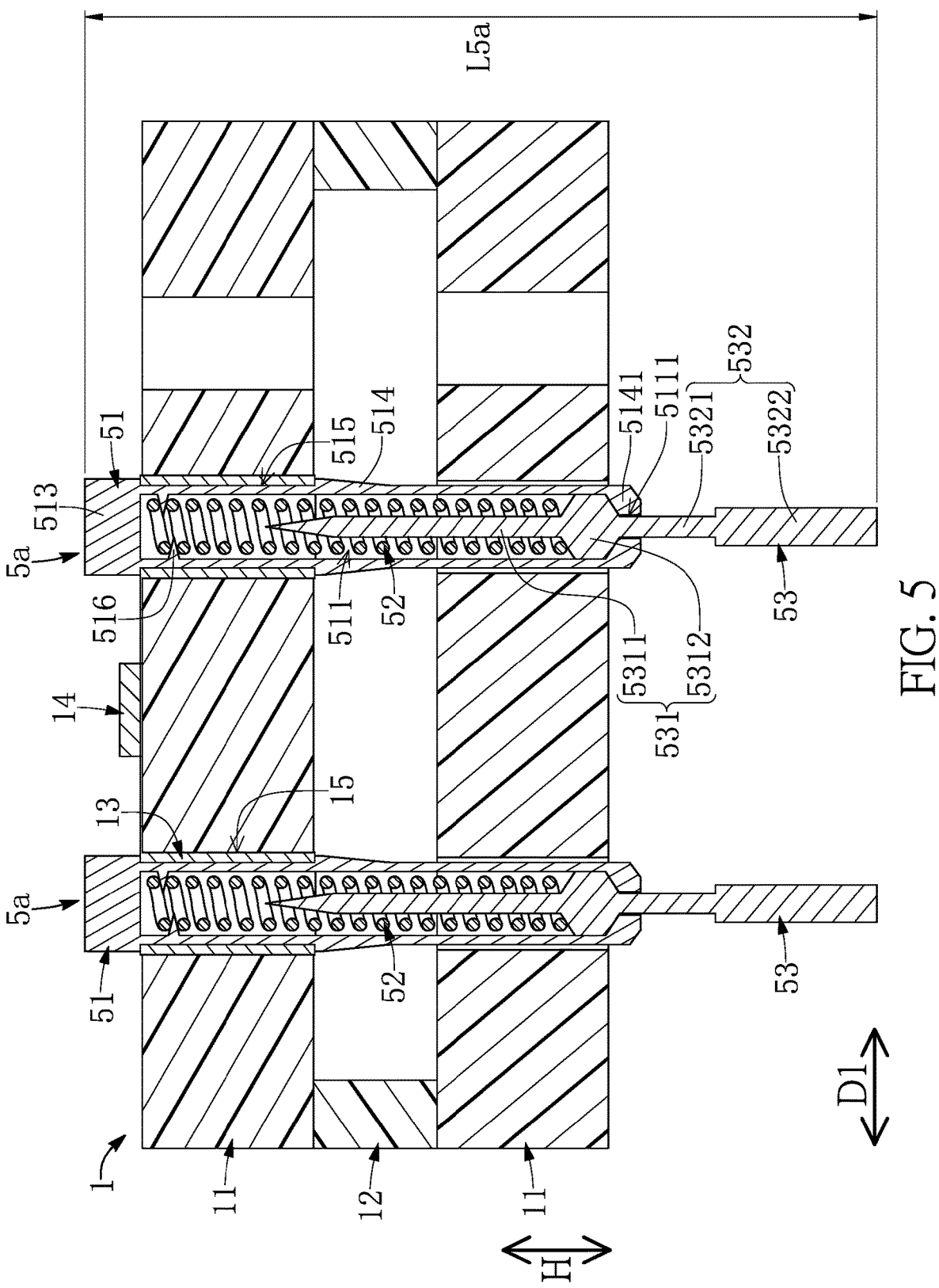
FIG. 5 is a schematic cross-sectional view taken along line V-V of FIG. 3.
Figure 6:
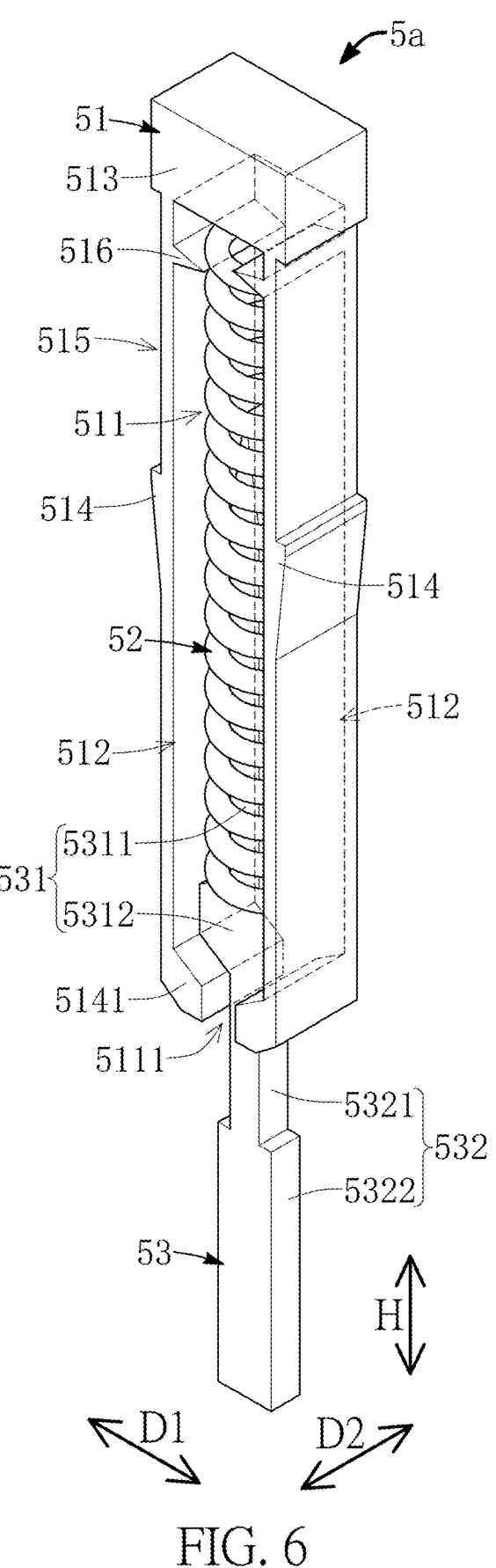
FIG. 6 is a schematic perspective view showing an open-type probe of FIG. 5.
Figure 7:
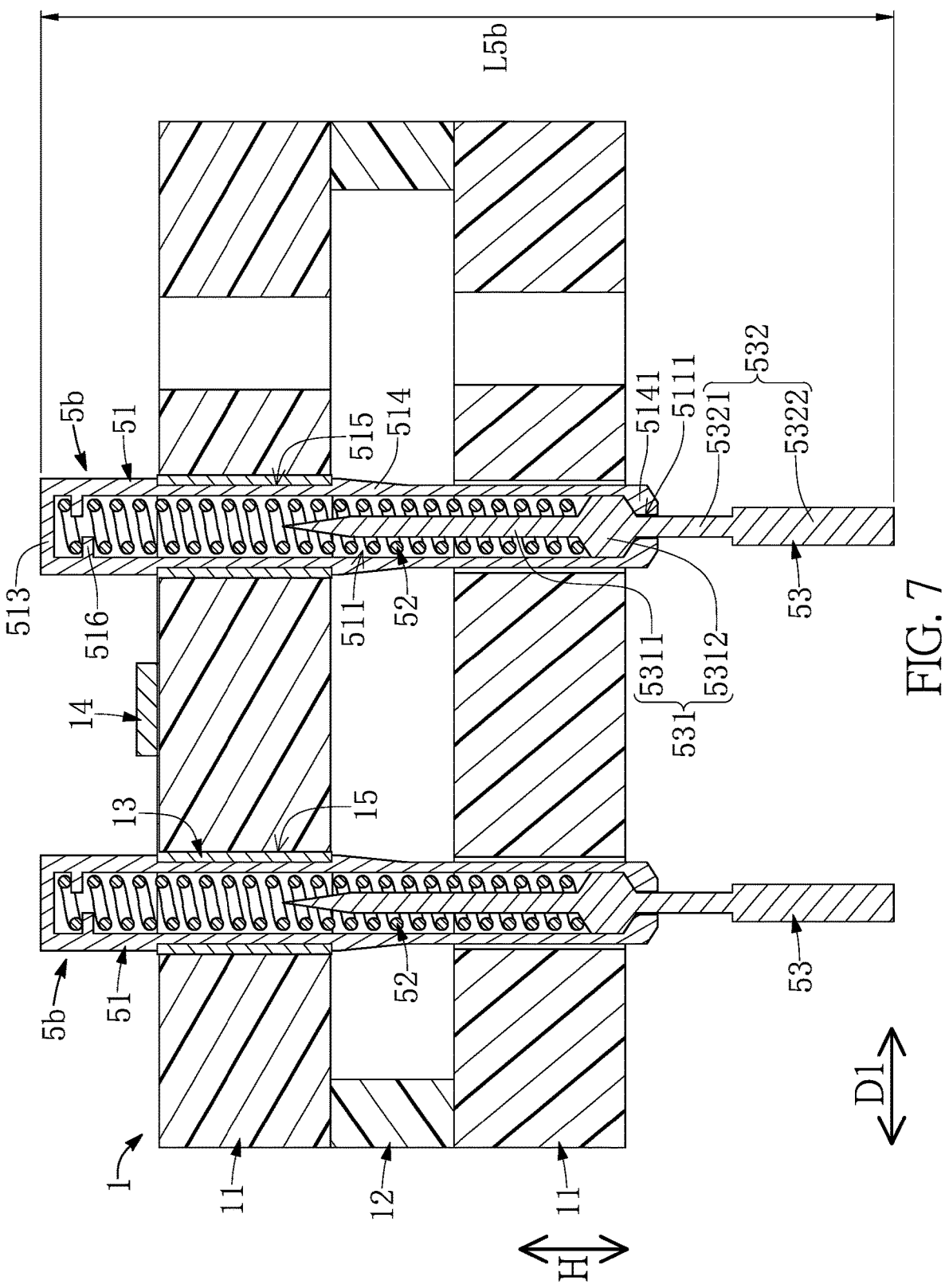
FIG. 7 is a schematic cross-sectional view taken along line VII-VII of FIG. 3.
Figure 8:
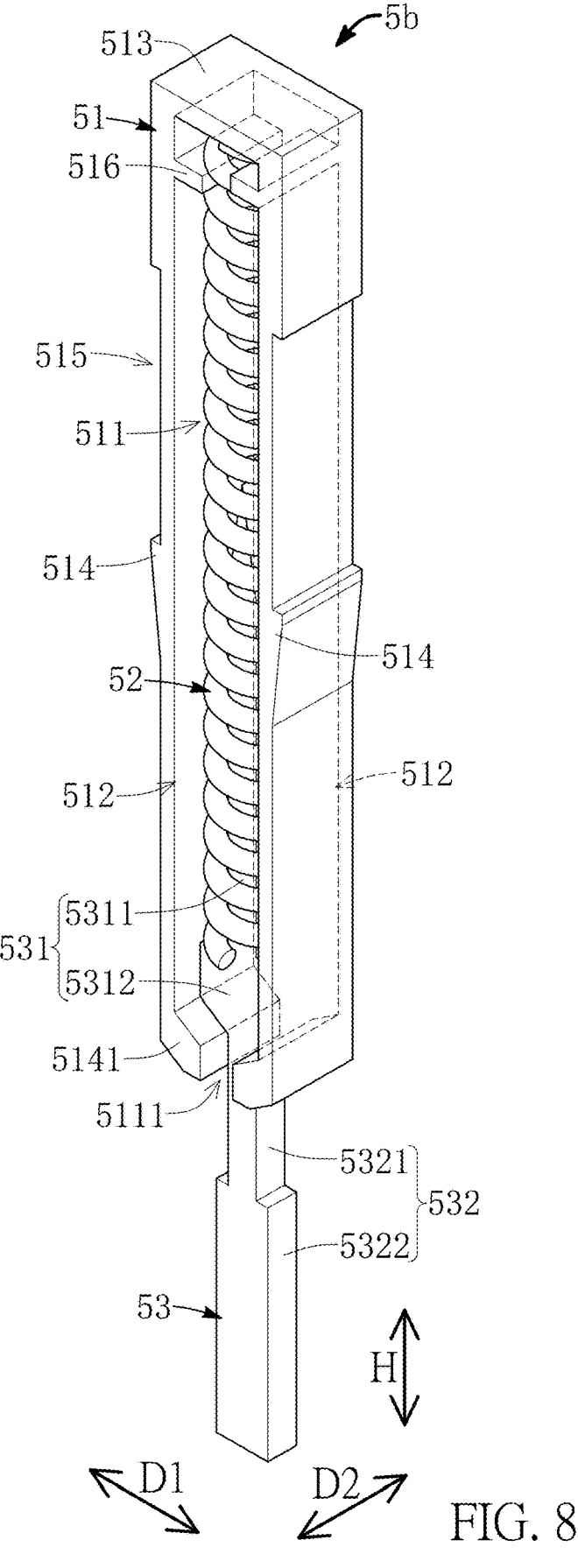
FIG. 8 is a schematic perspective view showing the open-type probe of FIG. 7.
Figure 9:
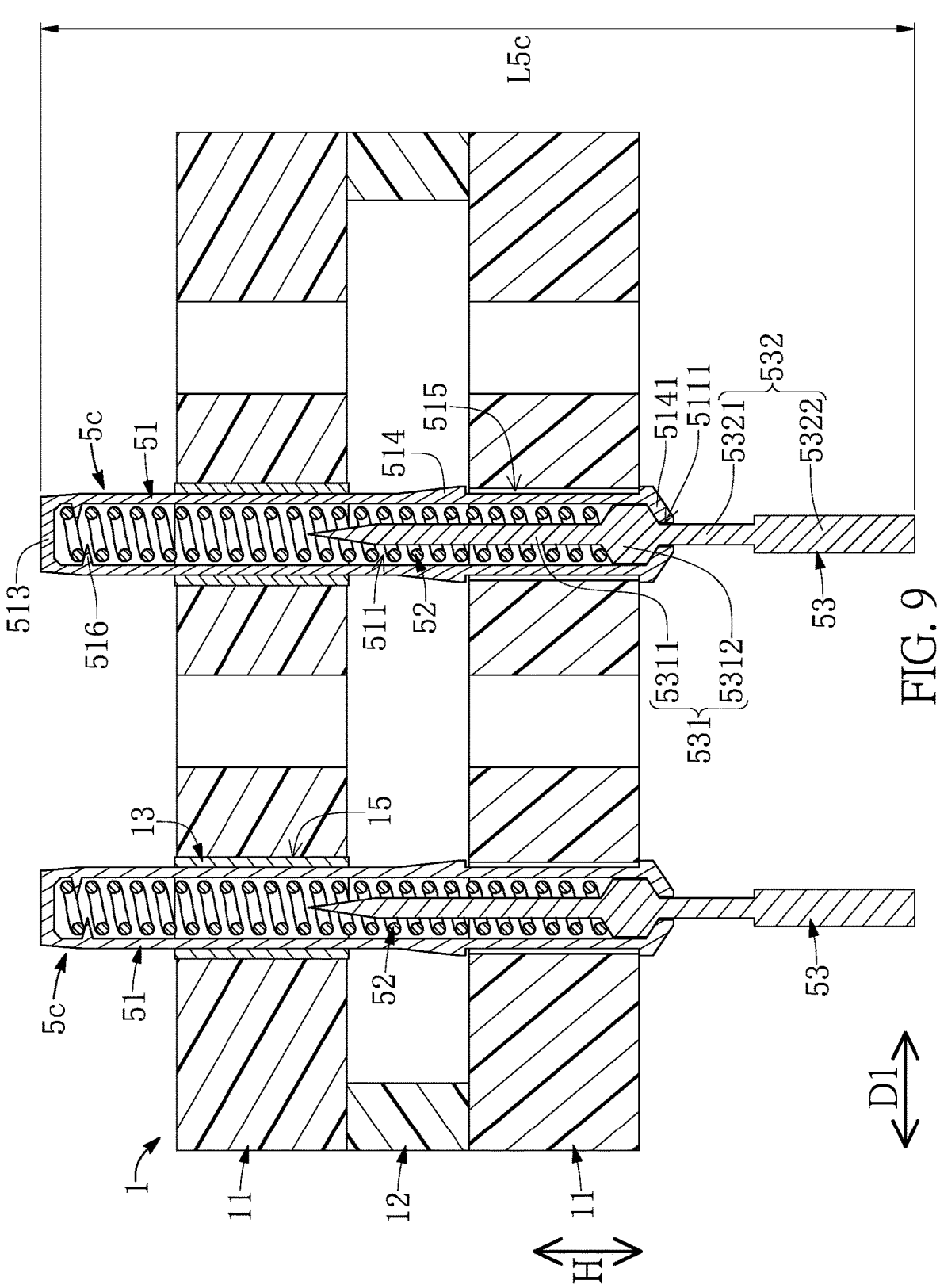
FIG. 9 is a schematic cross-sectional view taken along line IX-IX of FIG. 3.

As shown in FIG. 5, FIG. 7, and FIG. 9, as the open-type probes 5a, 5b, 5c in the present embodiment are of the substantially same structure and have a plurality of (e.g., at least two of) different probe lengths L5a, L5b, L5c, the following description discloses the same features of just one of the open-type probes 5a, 5b, 5c and then describes the different features of the open-type probes 5a, 5b, 5c for the sake of brevity, but the present disclosure is not limited thereto. For example, in other embodiments of the present disclosure not shown in the drawings, the open-type probes 5a, 5b, 5c of the vertical probe card 100 can be of the entirely same structure.

As shown in FIG. 4 to FIG. 10, the open-type probe 5a, 5b, 5c in the present embodiment is a structure formed by assembling three components, and includes a frame 51, an elastic member 52 assembled in the frame 51, and a pin 53 that is assembled to the frame 51 through the elastic member 52. Each of the frame 51, the elastic member 52, and the pin 53 is integrally formed as a single one-piece structure, but the present disclosure is not limited thereto.

Moreover, the probe length L5a, L5b, L5c of the open-type probe 5a, 5b, 5c can be less than 1 mm and can be less than 60% of a length of the conductive probe 4, thereby facilitating transmission of signals (e.g., a high-frequency signal, a high-speed signal, or a loop-back signal) that are not suitable to be transmitted by the conductive probe 4.

The frame 51 has an operation slot 511 and two lateral openings 512 that are in spatial communication with the operation slot 511. The frame 51 of the open-type probe 5a, 5b, 5c is coupled through and fixed in the first guide plate unit 1 (e.g., the frame 51 is fixed in the first guide plate unit 1 in an interference-fit manner), two ends of the frame 51 are respectively arranged outside of two opposite sides of the first guide plate unit 1, and an end opening 5111 of the operation slot 511 is arranged away from the second guide plate unit 2. In other words, the operation slot 511 is formed by being recessed from the end opening 5111 of the frame 51 along the thickness direction H.

Specifically, the operation slot 511 is in spatial communication with an external environment along the thickness direction H through the end opening 5111, and the operation slot 511 is in spatial communication with the external environment along the second direction D2 through any one of the two lateral openings 512. In other words, through any one of the two lateral openings 512, the operation slot 511 of the frame 51 can be in spatial communication with the corresponding thru-hole 15 that receives the open-type probe 5a, 5b, 5c.

In the present embodiment, the frame 51 is substantially U-shaped, and the frame 51 has an end wall 513 and two lateral arms 514 that are (perpendicularly) connected to the end wall 513. The two lateral arms 514 are arranged in one row along the first direction D1, ends 5141 of the two lateral arms 514 arranged away from the end wall 513 jointly define the end opening 5111 of the operation slot 511. In other words, a slot bottom of the operation slot 511 is an inner side of the end wall 513. Moreover, along the first direction D1, a distance between the ends 5141 of the two lateral arms 514 (i.e., a width of the end opening 5111) is less than a spacing distance between other portions of the two lateral arms 514.

Figure 10:
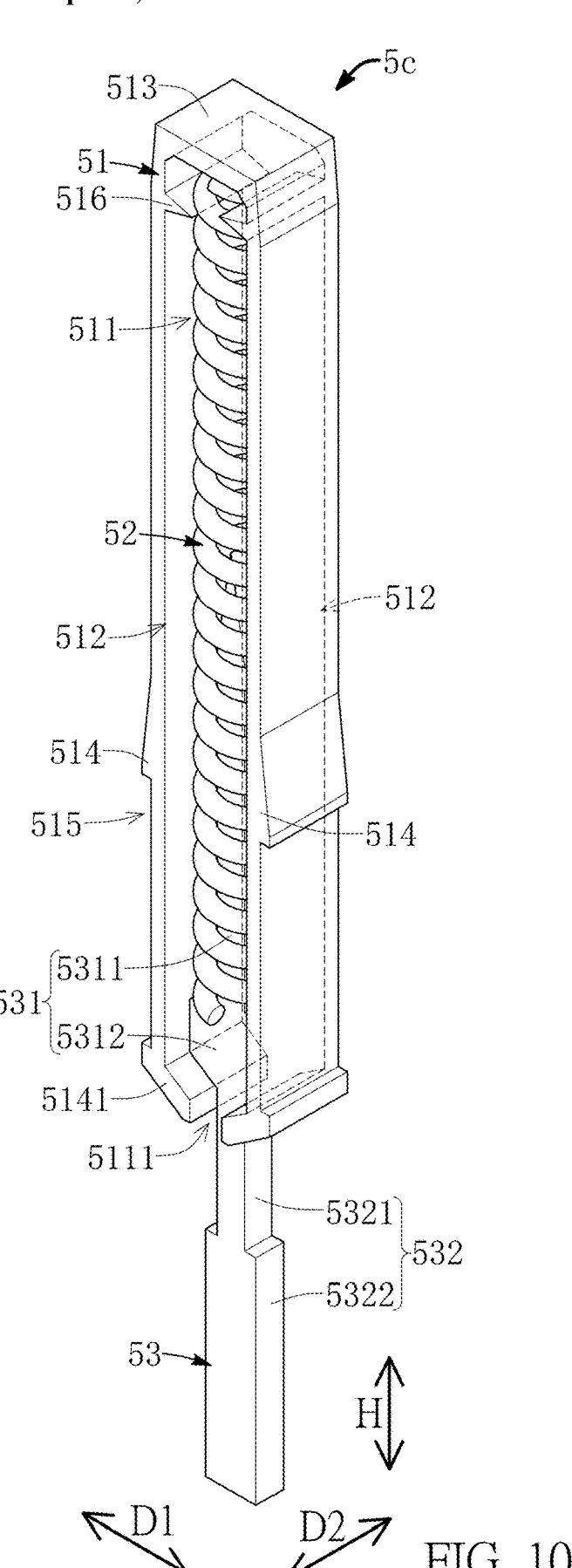
FIG. 10 is a schematic perspective view showing the open-type probe of FIG. 9.

Specifically, each of the two lateral arms 514 has an engaged slot 515 recessed in an outer side thereof, and the frame 51 can be engaged with and fixed to the first guide plate unit 1 through the engaged slots 515 of the two lateral arms 514. In the present embodiment, the two engaged slots 515 of the frame 51 are engaged with one of the two first plates 11. For example, the two engaged slots 515 of the open-type probe 5a, 5b shown in FIG. 5 to FIG. 8 are engaged with and fixed to the first plate 11 located at an upper side and adjacent to the second guide plate unit 2; or, the two engaged slots 515 of the open-type probe 5c shown in FIG. 9 and FIG. 10 are engaged with and fixed to the first plate 11 located at a lower side and away from the second guide plate unit 2.

The frames 51 of at least two of the open-type probes 5a, 5b, 5c are connected to at least one of transmission circuits 13 so as to be electrically coupled to each other. In the present embodiment, any two of the open-type probes 5a, 5b, 5c are electrically coupled to each other by using inner walls of the engaged slots 515 to abut against portions of the transmission circuit 13 arranged in the corresponding thru-holes 15, or by using portions of the frames 51 exposed from the first guide plate unit 1 to abut against a portion of the transmission circuit 13 formed on the board surface of the first plate 11.

In addition, an inner side of each of the two lateral arms 514 of the open-type probes 5a, 5b, 5c has a positioning protrusion 516 that is arranged away from the end opening 5111 (and that is arranged adjacent to the end wall 513), and the positioning protrusions 516 of the two lateral arms 514 are spaced apart from each other in a staggered manner and are arranged in the operation slot 511. It should be noted that the positioning protrusions 516 of the open-type probes 5a, 5b, 5c can be arranged in the corresponding thru-hole 15 (e.g., the open-type probes 5a shown in FIG. 5 and FIG. 6) or arranged outside of the first guide plate unit 1 (e.g., the open-type probes 5b shown in FIG. 7 and FIG. 8, and the open-type probes 5c shown in FIG. 9 and FIG. 10) according to design requirements.

The elastic member 52 in the present embodiment is a compression spring, but the present disclosure is not limited thereto. The elastic member 52 is fixed to the two positioning protrusions 516 of the frame 51 and is located in the operation slot 511, and the elastic member 52 is not covered by the frame 51 along the second direction D2. In other words, the elastic member 52 of the present embodiment can be assembled into the operation slot 511 along the second direction D2 by passing through any one of the two lateral openings 512.

The pin 53 is elongated and has an inner segment 531 and a contacting segment 532 that is connected to the inner segment 531. The elastic member 52 is compressed by (or clamped between) the frame 51 and the inner segment 531 so as to establish an electrical connection between the frame 51 and the pin 53. The contacting segment 532 protrudes from the end opening 5111 and the first guide plate unit 1 for abutting against a device under test (DUT) 300.

Moreover, the pin 53 is not covered by the frame 51 along the second direction D2. In other words, the inner segment 531 of the pin 53 can be inserted into the elastic member 52, and then the pin 53 and the elastic member 52 are jointly assembled in the frame 51 along the second direction D2 by passing through any one of the two lateral openings 512, such that the elastic member 52 and the inner segment 531 of the pin 53 are arranged between the two lateral openings 512 (and are located in the operation slot 511).

Accordingly, the open-type probe 5a, 5b, 5c of the present embodiment is provided with the frame 51 having a specific structural design (e.g., the frame 51 having the two lateral openings 512), so that the elastic member 52 and the pin 53 can be easily assembled to the frame 51 for reducing the manufacturing difficulty and maintenance complexity of the open-type probe 5a, 5b, 5c.

Moreover, the frame 51 of the open-type probe 5a, 5b, 5c provided by the present embodiment can clamp the inner segment 531 of the pin 53 through the two lateral arms 514, thereby effectively increasing the movement stability of the pin 53 and further stabilizing the electrical connection between the frame 51 and the pin 53.

Specifically, the inner segment 531 in the present embodiment has a limiting rod 5311 and a slider 5312 that is connected to (an end of) the limiting rod 5311. The limiting rod 5311 is inserted into the elastic member 52, and a length of the limiting rod 5311 is approximately within a range from 40% to 60% of a length of the elastic member 52. The slider 5312 is sandwiched between the two lateral arms 514 along the first direction D1, one end of the slider 5312 abuts against the elastic member 52, and another end of the slider 5312 abuts against the ends 5141 of the two lateral arms 514. In other words, the elastic member 52 arranged in the operation slot 511 has a predetermined pressure for driving the slider 5312 of the inner segment 531 to keep abutting against the ends 5141 of the two lateral arms 514.

Moreover, the contacting segment 532 in the present embodiment has a track region 5321 connected to the inner segment 531 (e.g., the slider 5312) and an abutting region 5322 that is connected to the track region 5321. Specifically, along the first direction D1, a width of the track region 5321 is less than or equal to the width of the end opening 5111, and a width of the abutting region 5322 is greater than the width of the end opening 5111.

In summary, when the contacting segment 532 of the pin 53 of each of the open-type probes 5a, 5b, 5c abuts against the DUT 300, the contacting segment 532 is moved toward the operation slot 511 (e.g., the track region 5321 can be moved into the operation slot 511 by passing through the end opening 5111), and the inner segment 531 presses the elastic member 52, such that the elastic member 52 is deformed to generate an elastic force.

Beneficial Effects of the Embodiment

In conclusion, the open-type probe of the vertical probe card in the present disclosure is provided with the frame having a specific structural design (e.g., the frame having the two lateral openings), so that the elastic member and the pin can be easily assembled to the frame for reducing the manufacturing difficulty and maintenance complexity of the open-type probe. Specifically, the structural improvement of the open-type probe provided by the present disclosure is based on the operation and configuration of the vertical probe card, such that the improvement does not need to be limited by the structure of pogo pins that are applied in other technical fields.

Moreover, the probe length of the open-type probe in the vertical probe card provided by the present disclosure is much smaller than the length of the conductive probe, thereby facilitating transmission of signals (e.g., a high-frequency signal, a high-speed signal, or a loop-back signal) that are not suitable to be transmitted by the conductive probe.

Specifically, the frame of the open-type probe provided by the present disclosure can clamp the inner segment of the pin through the two lateral arms, thereby effectively increasing the movement stability of the pin and further stabilizing the electrical connection between the frame and the pin.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A vertical probe card, comprising:
a first guide plate unit;
a second guide plate unit corresponding in position to and spaced apart from the first guide plate unit along a thickness direction;
a plurality of conductive probes assembled to the first guide plate unit and the second guide plate unit, wherein each of the conductive probes includes:
a transmission segment having two end portions respectively arranged in the first guide plate unit and the second guide plate unit;
a testing segment that extends from one of the two end portions of the transmission segment to protrude out of the first guide plate unit; and
a transferring segment that extends from another one of the two end portions of the transmission segment to protrude out of the second guide plate unit; and
a plurality of open-type probes assembled to the first guide plate unit, wherein each of the open-type probes includes:
a frame coupled through and fixed in the first guide plate unit, wherein the frame has an operation slot and two lateral openings that are in spatial communication with the operation slot, and an end opening of the operation slot is arranged away from the second guide plate unit, and wherein the frame has an end wall and two lateral arms that are connected to the end wall, and ends of the two lateral arms arranged away from the end wall jointly define the end opening of the operation slot;

an elastic member assembled in the frame and arranged in the operation slot; and a pin having an inner segment assembled in the operation slot and a contacting segment that is connected to the inner segment, wherein the inner segment has:

a limiting rod inserted into the elastic member; and a slider connected to the limiting rod and the contacting segment, wherein the slider is sandwiched between the two lateral arms, one end of the slider abuts against the elastic member, and another end of the slider abuts against the ends of the two lateral arms;

wherein the elastic member is compressed by the frame and the inner segment so as to establish an electrical connection between the frame and the pin, and the contacting segment protrudes from the end opening and the first guide plate unit, and wherein the elastic member and the inner segment of the pin are located between the two lateral openings;

wherein, in each of the open-type probes, the contacting segment of the pin is configured to abut against a device under test (DUT), so that the contacting segment is moved toward the operation slot, and the inner segment presses the elastic member, such that the elastic member is deformed to generate an elastic force.

2. The vertical probe card according to claim 1, wherein, in each of the open-type probes, two lateral arms are arranged in one row along a first direction perpendicular to the thickness direction, and the elastic member and the pin are not covered by the frame along a second direction that is perpendicular to the thickness direction and the first direction.

3. The vertical probe card according to claim 2, wherein, in each of the open-type probes, an inner side of each of the two lateral arms has a positioning protrusion arranged away from the end opening, the positioning protrusions of the two lateral arms are staggered with each other, and the elastic member is fixed to the positioning protrusions of the two lateral arms.

4. The vertical probe card according to claim 2, wherein, in each of the open-type probes, each of the two lateral arms has an engaged slot recessed in an outer side thereof, and wherein the first guide plate unit includes:

two first plates spaced apart from each other along the thickness direction, wherein the engaged slots of the two lateral arms of each of the open-type probes are engaged with and fixed to one of the two first plates; and a partition plate sandwiched between the two first plates.

5. The vertical probe card according to claim 1, wherein the first guide plate unit includes at least one transmission circuit, and the frames of at least two of the open-type probes are connected to the at least one transmission circuit so as to be electrically coupled to each other.

6. The vertical probe card according to claim 5, wherein the first guide plate unit has a plurality of thru-holes, each of the open-type probes is coupled through one of the thru-holes, and the first guide plate unit includes at least one electronic component connected to the at least one transmission circuit, and wherein the at least one electronic component and the thru-holes are in a matrix arrangement.

7. The vertical probe card according to claim 1, wherein, in each of the open-type probes, two ends of the frame are respectively arranged outside of two opposite sides of the first guide plate unit, and wherein the open-type probes have at least two different probe lengths.

8. The vertical probe card according to claim 1, wherein the first guide plate unit has a plurality of thru-holes, and each of the open-type probes is coupled through one of the thru-holes, and wherein, in each of the open-type probes, the operation slot of the frame is in spatial communication with the corresponding thru-hole through any one of the two lateral openings.

9. An open-type probe of a vertical probe card, comprising:

a frame having an operation slot and two lateral openings that are in spatial communication with the operation slot, wherein the operation slot has an end opening, and wherein the frame has an end wall and two lateral arms that are connected to the end wall, and ends of the two lateral arms arranged away from the end wall jointly define the end opening of the operation slot;

an elastic member assembled in the frame and arranged in the operation slot; and a pin having an inner segment assembled in the operation slot and a contacting segment that is connected to the inner segment, wherein the inner segment has:

a limiting rod inserted into the elastic member; and a slider connected to the limiting rod and the contacting segment, wherein the slider is sandwiched between the two lateral arms, one end of the slider abuts against the elastic member, and another end of the slider abuts against ends of the two lateral arms;

wherein the elastic member is compressed by the frame and the inner segment so as to establish an electrical connection between the frame and the pin, and the contacting segment protrudes from the end opening, and wherein the elastic member and the inner segment of the pin are located between the two lateral openings;

wherein the contacting segment of the open-type probe is configured to abut against a device under test (DUT), so that the contacting segment is moved toward the operation slot, and the inner segment presses the elastic member, such that the elastic member is deformed to generate an elastic force.

10. The open-type probe according to claim 9, wherein the two lateral arms are arranged in one row along a first direction, and the elastic member and the pin are not covered by the frame along a second direction that is perpendicular to the first direction.

* * * * *